United States Patent
Li et al.

(10) Patent No.: US 6,582,779 B2
(45) Date of Patent: *Jun. 24, 2003

(54) SILICON NITRIDE COMPONENTS WITH PROTECTIVE COATING

(75) Inventors: Chien-Wei Li, Livingston, NJ (US); Derek Raybould, Denville, NJ (US); Milton Ortiz, Scottsdale, AZ (US); Thomas Edward Strangman, Phoenix, AZ (US)

(73) Assignee: AlliedSignal, Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,826

(22) Filed: Aug. 11, 1999

(65) Prior Publication Data

US 2002/0081396 A1 Jun. 27, 2002

(51) Int. Cl.$^7$ ............................................. C23C 14/30
(52) U.S. Cl. ................... 427/585; 427/596; 427/255.31; 427/376.2; 427/377; 427/427; 427/429
(58) Field of Search .................................. 427/585, 596, 427/255.31, 376.2, 377, 427, 429

(56) References Cited

U.S. PATENT DOCUMENTS

| | | | | |
|---|---|---|---|---|
| 4,421,525 A | * | 12/1983 | Sarin et al. | |
| 4,643,858 A | * | 2/1987 | Mizutani | |
| 4,904,542 A | | 2/1990 | Mroczkowskir | |
| 5,198,152 A | * | 3/1993 | Liimatta et al. | |
| 5,320,909 A | | 6/1994 | Scharman et al. | |
| 5,716,720 A | * | 2/1998 | Murphy | |
| 5,851,679 A | | 12/1998 | Stowell et al. | |
| 5,863,668 A | | 1/1999 | Brindley et al. | |
| 5,876,860 A | | 3/1999 | Marijnissen et al. | |
| 5,906,895 A | | 5/1999 | Hamada et al. | |
| 6,159,553 A | * | 12/2000 | Li et al. | |

OTHER PUBLICATIONS

Chien Wei Li et al., "Thermal Barrier Coating for Silicon Nitride" filed by U.S. Air Force on date unknown.

Patent Abstracts of Japan, Heat–Resistant Ceramic and its Production, vol. 1995, No. 01, JP 06 2875095 A, Published Oct. 11, 1994.

* cited by examiner

Primary Examiner—Timothy Meeks
(74) Attorney, Agent, or Firm—William J. Zak, Jr. Esq.

(57) ABSTRACT

A turbomachine component includes a silicon nitride substrate and a multi-layer coating bonded to the substrate. The coating includes an interlayer of porous fibrous silicon nitride having a density of between 85–98%. The coating also includes an outer layer formed of an oxide compound, preferably tantalum oxide, that is applied by Electron Beam-Physical Vapor Deposition. The combination of the silicon nitride interlayer and tantalum oxide outer layer serves to protect the substrate from the adverse affects of oxidation, impact by foreign objects and extreme operating temperatures.

22 Claims, 1 Drawing Sheet

US 6,582,779 B2

SILICON NITRIDE COMPONENTS WITH PROTECTIVE COATING

BACKGROUND OF THE INVENTION

The present invention relates to turbomachines and similar apparatus having components formed of silicon nitride ceramic material. More specifically, the present invention relates to protective coatings for such components.

Certain components of gas turbines are often coated or even formed from silicon nitride ceramic material to counteract the adverse effects of oxidation and water vapor that can occur at extremely high operating temperatures. Such components may include the turbine blades, rotors, and nozzles. By forming turbomachine components of silicon nitride, it becomes possible to operate the turbomachines with improved efficiency and reduced pollutant emissions at temperatures above 1200° C. However, for operating temperatures approaching 1480° C., even silicon nitride blades, rotors and nozzles can be adversely effected by oxidation and water vapor present in the flow stream.

It would be desirable to protect the silicon nitride substrates of the components in a way that reduces oxidation and also provides a thermal barrier. Partially stabilized zirconia (PSZ) has been employed as a thermal barrier coating for components made of superalloy. However there is a significant mismatch in the thermal expansion coefficient between zirconia ($\sim 10 \times 10^{-6}$) and silicon nitride ($\sim 3.5 \times 10^{-6}$). Because of this thermal mismatch, thermal cycling can easily debond the coating from the silicon nitride substrate. In addition, zirconia is a fast ionic conductor for oxygen and a poor oxidation barrier.

Though silicon nitride blades and nozzles have exhibited excellent mechanical and thermal properties, even when employed in flow streams at temperatures in excess of 1200° C., silicon nitride is not without its drawbacks. One drawback is impact failure, generally caused by foreign objects such as carbon or metallic particles encountered in the turbine engine flow stream. Because of this drawback, there has been some reluctance to even employ silicon nitride turbine components.

To overcome the low impact resistance problem, it would be desirable to somehow strengthen the silicon nitride component substrate to enhance the impact resistance without adversely affecting the thermal properties of the substrate. It would also be desirable to minimize overall component weight.

SUMMARY OF THE INVENTION

The present invention is directed to machine components having substrates formed of silicon nitride. The substrate is coated with an interlayer of silicon nitride having a porous fibrous surface with a density in the range of about 85–98%. An outer layer of tantalum oxide or similar compound having a thermal coefficient in the range of $2.5 \sim 5.0 \times 10^{-6}$ may cover the interlayer.

Another aspect of the invention is directed to a process for coating turbomachine components with a multi-layered coating. The method includes the step brushing or spraying an interlayer of a silicon nitride powder slurry onto the component substrate. The slurry and substrate composition are then sintered at a temperature in excess of 1700° C. to grow porous fibers on the composition. The composition is then infiltrated with a precursor solution which may include a pre-ceramic polymer. The composition is heated to convert the precursor into a matrix surrounding the fibrous silicon nitride layer in order to protect the component during operation. The interlayer has a density in the range of 90–98%.

An outer layer of tantalum oxide may be applied to the outer surface of the interlayer by Electron Beam-Physical Vapor Deposition.

DETAILED DESCRIPTION OF THE INVENTION

Figure 1:
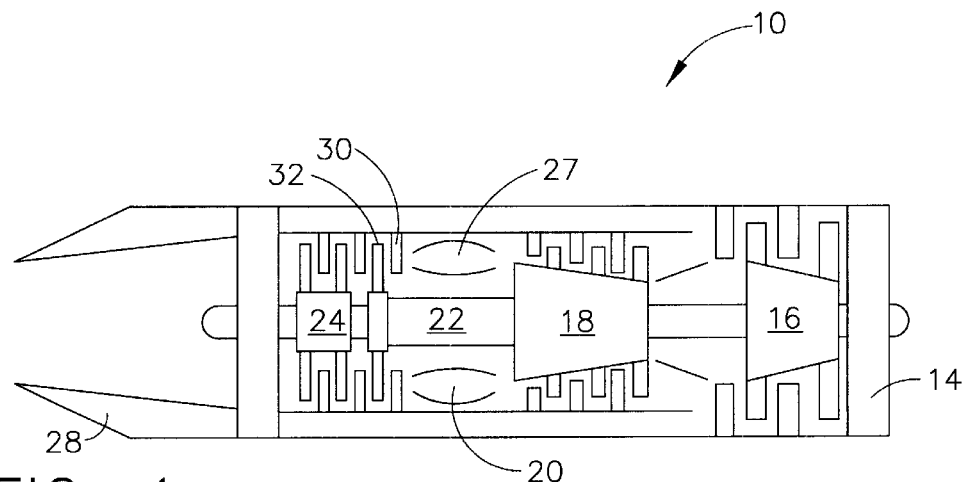
FIG. 1 is an illustration of a gas turbine engine having components formed in accordance with the present invention.

Referring to FIG. 1, a gas turbine engine 10 includes, in serial flow relation from inlet to exhaust, an inlet frame 14, a two stage low pressure compressor ("LPC") or fan 16, a three stage high pressure compressor ("HPC") 18 and a combustor 20. In addition, the engine 10 includes a single stage high pressure turbine ("HPT") 22, a two stage low pressure turbine ("LPT") 24, a turbine frame 26, and an exhaust nozzle 28. Each of the turbines 22 and 24 includes a plurality of stationary turbine vanes 30 and a plurality of rotating turbine blades 32. The design of the turbine engine 10, in itself, is discussed to better understand the components that make up the present invention. During operation of the turbine engine 10, a stream of air S enters the engine assembly 10 through inlet 14, travels through the open interior 27 of the engine assembly 10 and exits through outlet nozzle 28. As the stream S passes through the engine 10, high temperature combustion effluent gases mix with the stream S as it passes through interior 27 before being expelled by nozzle 28.

The turbine vanes 30 and 32 may be formed of silicon nitride. However, if the stream S achieves temperatures of about 1480° C., as may well occur during operation of the turbine engine 10, uncoated silicon nitride components would be adversely affected by the excessive thermal temperatures as well as by oxidation from any water vapor present. In addition, the uncoated silicon nitride can be sensitive to impact by foreign particles.

Figure 2:
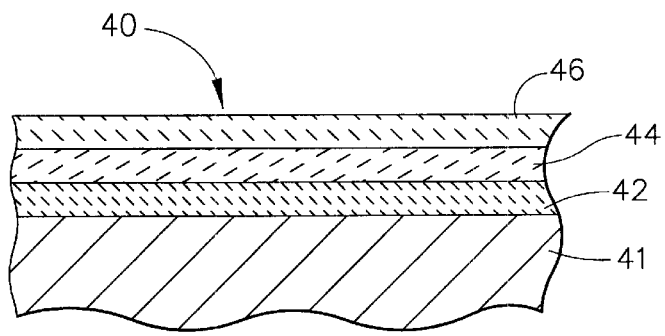
FIG. 2 is an illustration an engine component formed in accordance with the present invention.

As shown in FIG. 2, a multi-layer coating 40, formed in accordance with the present invention, is applied to an outer substrate 41 of a turbomachine component such as a turbine vane 32. The substrate of turbine vane 32 is made of a dense silicon nitride having density of greater than 99.3%. The multi-layer coating 40 includes an interlayer 42 directly applied to the silicon nitride substrate 41 and an outer layer 44 applied to interlayer 42.

Preferably, the interlayer 42 comprises a fibrous composite layer of beta silicon nitride. The interlayer 42 is porous and has a whisker-like microstructure exhibiting high impact resistance due to its high fracture toughness and ability to absorb impact energy. The interlayer 42 has good adhesive properties, assuring that the outer layer 44 will permanently bond to the interlayer 42. The interlayer 42 has a thickness in the range of about 0.5 mil to 20.0 mil and, preferably, from about 1.0 mil to 10.0 mil. The density of the fibrous silicon nitride making up the interlayer 42 is about 85–98%. That is, the porosity of the interlayer 42 is between 2–15%.

This high density is achieved by repeated infiltration of the interlayer 42 as will be explained. Because of the repeated infiltration step, the density of the interlayer 42 can reach 90–98%.

The outer layer 44 envelopes the interlayer 42 and functions as a thermal barrier. The outer layer 44 is chosen to have a thermal expansion coefficient that approximates that of silicon nitride, or $\sim 3.5 \times 10^{-6}$. Preferably, the outer layer 44 is formed of dense tantalum oxide, $Ta_2O_5$. Alternatively, oxide compounds having a thermal match, i.e. in a range of $2.5 \sim 5.0 \times 10^{-6}$ may be substituted for the Tantalum. Such compounds may include the oxides of hafninum ("Hf"), niobium ("Nb"), titanium ("Ti"), nickel ("Ni"), tungsten ("W"), aluminum ("Al"), magnesium ("Mg"), strontium ("Sr"), or zirconium ("Zr"). An outer layer 44 of tantalum oxide has a thickness that ranges from about 0.2 to 20.0 mil and, preferably from about 1.0 to 10.0 mil.

Figure 3:
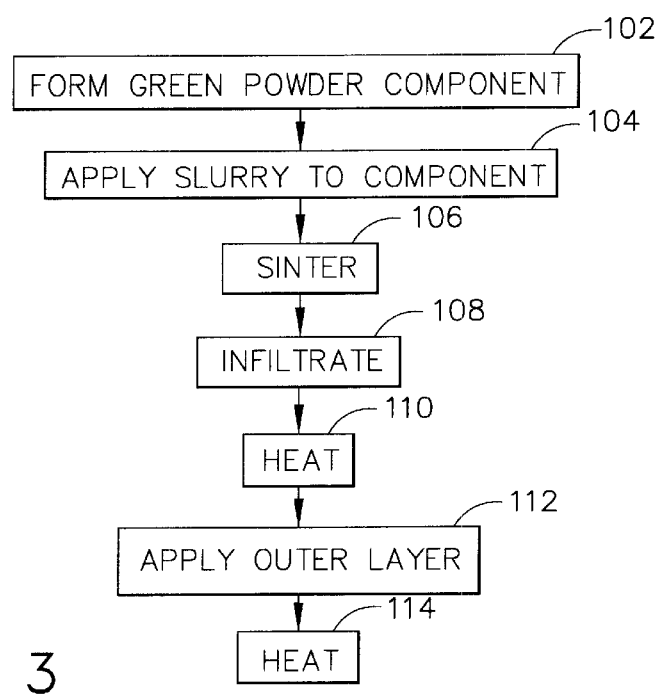
FIG. 3 is a flowchart of a method of coating a silicon nitride substrate.

Reference is now made of FIG. 3, which illustrates a method of manufacturing turbomachine components such as nozzles 28 and vanes 30, 32 of silicon nitride. Preferably, the components are manufactured by the powder metallurgy process. Such a process includes forming green powder compacts of the various components to be manufactured (step 102). The interlayer 42 is then formed when a silicon nitride powder slurry is sprayed or brushed 104 onto the substrate 41 of the green components (step 104). The powder in the slurry includes silicon nitride and certain additives.

The additives directly affect the sintering of the silicon nitride and may consist of rare earth oxides, nitrides and oxides/nitrides of Al, Mg, Sr or the like. Powders that serve to hinder sintering of silicon nitride, such as BN, may also be added to control the amount of shrinkage of the interlayer 42 applied during the manufacturing process. Because the interlayer 42 has a lower green density than the underlying green silicon nitride components, the interlayer 42, once applied to substrate 41, may shrink excessively compared to the substrate 41 if the amount of the sintering aid in the slurry is excessive. This, in turn, results in detachment of the interlayer 42 from the substrate 41. Alternatively, if the sintering aids are not included, or an insufficient amount is present, interlayer 42 would not shrink a sufficient amount during sintering to substrate 41, causing interlayer 42 to detach from substrate 41. Preferably, the sintering aids are in the range of 2–20 wt % of the total amount present.

Once the interlayer 42 is sprayed or brushed onto the substrate 41 during step 104, the turbomachine components along with the interlayer 42 undergo a reaction or sintering step 106 at a temperature in excess of 1700° C. (step 106). This step causes beta silicon nitride fibers to form and grow in both the substrate and the interlayer 42 until they reach a length that may exceed 100 microns. The use of a combination liquid and vapor phase process along with the open space defined by substrate 41 ensures that growth of the fibers will be fast and uninhibited. The silicon nitride fibers form whiskers that extend between substrate 41 and the interlayer 42, binding the interlayer to the substrate 41.

Once the substrate 41 and interlayer 42 have been sintered during step 106, a solution precursor is infiltrated into the porous, fibrous surface of interlayer 42 by dipping the substrate 41 and attached interlayer 42 into a liquid solution (step 108). The liquid infiltration solution can be a pre-ceramic polymer which converts to a silicon-nitrogen-carbon glass after pyrolsis, or a pre-ceramic polymer pre-mixed with filler powders. For example, a commercially available liquid polyureasilazane polymer with the addition of 0.5 wt % peroxide may be utilized as initiator. The filler powder may be an oxide, carbide, nitride or metal. The solution is not limited to a pre-ceramic polymer. Filler powders may be mixed with other inorganic liquids for infiltration.

The infiltration step 108 is preferably conducted under vacuum to assist in liquid penetration of the interlayer 42. During the next step 110, pyrolysis occurs when a stream of Ar or nitrogen is applied to the component and attached interlayer as they are heated to a temperature of between 500–2000° C. in graphite furnace for approximately thirty (30) minutes. The heating serves to convert the precursor into crystalline or amorphous ceramics that form a matrix surrounding the fibrous material. When a ceramic precursor is utilized in the infiltration step, oxide, carbide, nitride or their combination will be present after the pyrolysis treatment is completed. It may include compounds based on S—N—C—X where X represents other ions such as B.

The infiltration and pyrolysis steps 108 and 110 may be repeated as many times as required to form a dense coating of Si—N—C material reinforced by fibrous beta silicon nitride. The attached interlayer 42 protects substrate 41 against oxidation, it is damage resistant and it functions as a thermal barrier coating. The interlayer 42 also provides a bond coating for the outer layer 44.

The outer layer 44 may comprise a ceramic powder, preferably tantalum oxide, which can be applied to the interlayer 42 by a variety of known methods including Plasma Spray Coating, Electron Beam PVD, and chemical vapor deposition on silicon nitride. In place of tantalum oxide, oxide compounds with a thermal expansion coefficient of between $2.5 \sim 5.0 \times 10^{-6}$ including Hf, Nb, Ti, Ni, W, Al, Mg, Sr, Zr or the like may be employed. Fillers from oxide, carbide, nitride also may be incorporated into the outer layer 44 as desired.

In order to apply the outer coating 44 of tantalum oxide to the interlayer 42 (already bonded to the silicon nitride substrate 41), a plasma sprayer assembly may be employed. The ceramic tantalum oxide powder is fed into a high velocity, high temperature plasma flow which is directed against the silicon nitride substrate 41 and attached interlayer 42 in step 112. Due to the high plasma temperature, the ceramic powder becomes molten, and subsequently is quenched and solidified on the cooler silicon nitride interlayer 42. The silicon nitride component with attached coating 40 may be heated to about 1000° C. during step 114, to improve bonding between the plasma sprayed outer layer 44 and interlayer 42 of coating 44.

In an alternative method of accomplishing step 112, an Electron Beam-Physical vapor Deposition (EB-PVD) process may be employed. EB-PVD offers several significant benefits over that of a chemical vapor deposition (CVD) coating process. The coating rate using EB-PVD is much faster than that of CVD, and the bonding created by the EB-PVD process to a silicon nitride substrate is much stronger. In the EB-PVD process a high-energy electron beam is focused on an ingot of the material to be deposited (e.g., tantalum oxide). The electron bombardment results in high local heating on the coating material, which material evaporates at the atomic level and condenses on the component. A chemical bond is formed between the outer layer 44 and the interlayer 42. The substrate 41 and attached interlayer 42 are preferably preheated to improve bonding with the outer layer 44.

While the interlayer 42 and the outer layer 44 work together to maximize protection of component substrate 41, the outer layer 44 may be applied directly onto the substrate 41. To coat the silicon nitride substrate 41 directly with tantalum oxide, either pure tantalum or a tantalum oxide ingot is used with the EB-PVD process. Whether applying the outer layer 44 to the inner layer 42 or directly to substrate 41, oxygen is bled into the EB-PVD system during the evaporation of the pure tantalum or tantalum oxide ingot, to react with the tantalum-containing vapor to form tantalum oxide. If the outer layer 44 is applied directly to the substrate 41, the outer surface of the substrate 41 may be roughened to increase the bond with the outer layer 44.

The coating 40 may include one or more additional layers applied to outer layer 44 to provide further thermal insulation and impact resistance to foreign objects striking the component during operation of the turbomachine (see FIG. 1 at 46). For example, a layer of zirconia may be applied to the outer layer 44 to increase its ability to function as a thermal barrier.

This invention is further described, although not limited by the following examples:

EXAMPLE 1

A silicon nitride aqueous slurry slip is prepared by ball milling for 22 hours. The aqueous slurry includes a silicon nitride composition consisting of 82 wt % $Si_3N_4$, 4 wt % $Y_2O_3$, 3 wt % $La_2O_3$, 1 wt % SrO and 10 wt % SiC. To improve the slip quality, 0.5% Darven C Standard slipcasting is performed using the slurry to form a green piece of ~2.2"×2.2"×0.7." A portion of the slurry is further diluted to 50–60% solid loading by adding water, and the diluted slurry is applied by a commercial spray gun on the slipcast block. After the spray-coated block dries, it is loaded onto a graphite crucible and sintered in a graphite furnace at a temperature of about 1850° C. for about two hours under 100 psi nitrogen, 1950° C. for about three hours under 170 psi nitrogen and about 2025° C. for about two hours under 400 psi nitrogen. After sintering, the block is at about 99.5% of its theoretical density, and a coherent top layer consisting of a layer of fibrous beta silicon nitride is formed.

A commercially available liquid polyureasilazane polymer with 0.5 wt % peroxide as initiator is prepared. The sintered silicon nitride with fibrous top coating is immersed into the liquid polymer, and vacuum is applied to infiltrate the polymer into the porous fibrous layer. After the infiltration step is completed, the coated ceramic is pyrolized in a graphite furnace under flowing nitrogen for 30 minutes at 1000° C. After pyrolysis is completed, the polymer is converted into a Si—N—C material. After repeated polymer infiltration and pyrolysis is completed, a dense coating of Si—N—C material reinforced by the fibrous beta silicon nitride is formed. A block is machined into coupons of ~2"×0.12"×0.16" to undergo EBPVD coating of tantalum oxide. The coupons are degreased and then loaded into an EB-PVD system. The coupons are mounted to have the coated silicon nitride interlayer facing a tantalum ingot where a Ta vapor would be generated from bombardment by an electron beam. During the coating step, the coupons are heated to ~1000° C. to enhance bonding, and oxygen was bled into the system to form a tantalum oxide outer layer bonded to the silicon nitride interlayer.

EXAMPLE 2

A coating of tantalum oxide is applied to coupon of ~2"×1"×0.12" of silicon nitride substrate by a plasma spray process wherein a commercially available tantalum oxide ceramic powder was used as feedstock. The coupon is degreased, and then preheated to ~1000° C. by either a torch or a furnace. The tantalum oxide powder is then fed into a high velocity, high temperature plasma flow. The ceramic powder becomes molten and subsequently is quenched and solidified onto the fibrous silicon nitride coupon.

Turbine engine components other than blades, nozzles and rotors may be coated in accordance with the present invention. For example, turbine shrouds may be coated in accordance with the present invention. Moreover, the present invention is not limited to use in turbine engines.

Although the present invention has been described above with reference to specific embodiments, it is not so limited. Instead, the present invention is constructed according to the claims that follow.

What is claimed is:

1. A method of coating a silicon nitride substrate of a turbomachine component, the method comprising:

forming a layer of porous beta silicon nitride having whisker fibers extending into the substrate; and infiltrating an outer surface of the porous beta silicon nitride layer with a precursor solution and heating the precursor solution to densify the porous silicon nitride layer.

2. The coating method of claim 1, wherein the infiltrating includes dipping the substrate into a liquid solution formed of a pre-ceramic polymer.

3. The coating method of claim 1, wherein the porous beta silicon nitride is formed by applying a silicon nitride powder slurry onto the silicon nitride substrate; and sintering the applied slurry at a temperature in excess of 1700° C.

4. The coating method of claim 1, further comprising coating the fibrous silicon nitride and surrounding matrix with an oxide having a thermal expansion coefficient in the range of $2.5~5.0\times10^{-6}$.

5. The coating method of claim 4, wherein the oxide is applied by Electron Beam-Physical Vapor Deposition (EB-PVD).

6. The coating method of claim 4, wherein the oxide comprises an oxide of at least one element selected from the group consisting of Ta, Hf, Nb, Ti, W, Al, Mg, Sr, and Zr.

7. The coating method of claim 4, wherein the oxide is tantalum oxide.

8. The coating method of claim 1, wherein the infiltrating and densifying are repeated until the interlayer has a density in the range of 85%–98% wt.

9. The method of claim 1, further comprising infiltrating the outer surface of the porous beta silicon nitride layer with filler powder.

10. The method of claim 9, wherein the filler powder is selected from a group consisting of oxides, carbides and nitrides.

11. The coating method of claim 1, whereby a coating on the whiskers is formed, the coating including silicon, nitrogen, carbon, and boron.

12. The coating method of claim 1, wherein the precursor solution is heated to temperatures of about 2000° C.

13. A method of coating a component having a silicon nitride substrate, the component designed for operation at a temperature of about 1480C and greater, the method comprising:

forming a porous beta silicon nitride interlayer on the substrate, the interlayer having whisker fibers adhering to the substrate; and densifying the beta silicon nitride layer.

14. The method of claim 13, further comprising applying an oxide outer layer to the interlayer by Electron Beam-Physical Vapor Deposition, the oxide being an oxide of at least one element selected from the group consisting of Ta, Hf, Nb, Ti, W, Al, Mg, Sr, and Zr.

15. The method of claim 13, wherein the densifying further includes adding filler powder to the beta silicon nitride layer.

16. The method of claim 15, wherein the filler powder is selected from a group consisting of oxides, carbides and nitrides.

17. A method of applying a multi-layer coating to a silicon nitride material, the method comprising:
positioning an ingot of tantalum oxide adjacent to the material; and
bombarding the ingot with a high energy electron beam on the ingot, the ingot evaporating at the atomic level and condensing into a layer forming a chemical bond with the silicon nitride material.

18. The method of claim 17, further comprising forming the material prior to positioning the ingot.

19. The method of claim 18, wherein the material is formed by forming a porous layer of silicon nitride, and densifying the porous layer.

20. The method of claim 18, wherein the porous layer is a porous beta silicon nitride layer having whisker fibers.

21. The method of claim 20, wherein the porous layer is densified by infiltrating an outer surface of the porous beta silicon nitride layer with a precursor solution and heating the precursor solution to densify the porous silicon nitride layer and form glass on the whisker fibers.

22. A method of coating a silicon nitride substrate, comprising:
applying a silicon nitride powder slurry onto the silicon nitride substrate;
sintering the applied slurry to produce a layer of porous beta silicon nitride having whisker fibers extending into the substrate; and
infiltrating the outer surface of the porous beta silicon nitride layer with a pre-ceramic polymer and oxide powder to densify the porous silicon nitride layer.

* * * * *